United States Patent [19]

Morgan

[11] Patent Number: 5,774,487
[45] Date of Patent: Jun. 30, 1998

[54] FILAMENTED MULTI-WAVELENGTH VERTICAL-CAVITY SURFACE EMITTING LASER

[75] Inventor: Robert A. Morgan, Plymouth, Minn.

[73] Assignee: Honeywell Inc., Minneapolis, Minn.

[21] Appl. No.: 734,403

[22] Filed: Oct. 16, 1996

[51] Int. Cl.$^6$ .................................................. H01S 3/19
[52] U.S. Cl. .............................................. 372/45; 372/46
[58] Field of Search ................................ 372/96, 46, 45; 359/154, 344

[56] References Cited

U.S. PATENT DOCUMENTS

| | | | |
|---|---|---|---|
| 4,317,085 | 2/1982 | Burnham et al. | 372/50 |
| 4,660,207 | 4/1987 | Svilans | 372/45 |
| 4,784,722 | 11/1988 | Liau et al. | 438/34 |
| 4,885,592 | 12/1989 | Kofol et al. | 343/754 |
| 4,901,327 | 2/1990 | Bradley | 372/45 |
| 4,943,970 | 7/1990 | Bradley | 372/45 |
| 4,956,844 | 9/1990 | Goodhue et al. | 372/44 |
| 5,031,187 | 7/1991 | Orenstein et al. | 372/50 |
| 5,052,016 | 9/1991 | Mahbobzadeh et al. | 372/96 |
| 5,056,098 | 10/1991 | Anthony et al. | 372/45 |
| 5,062,115 | 10/1991 | Thornton | 372/50 |
| 5,068,869 | 11/1991 | Wang et al. | 372/45 |
| 5,115,442 | 5/1992 | Lee et al. | 372/45 |
| 5,140,605 | 8/1992 | Paoli et al. | 372/50 |
| 5,158,908 | 10/1992 | Blonder et al. | 438/32 |
| 5,216,263 | 6/1993 | Paoli et al. | 257/88 |
| 5,237,581 | 8/1993 | Asada et al. | 372/45 |
| 5,245,622 | 9/1993 | Jewell et al. | 372/45 |
| 5,258,990 | 11/1993 | Olbright et al. | 372/46 |
| 5,293,392 | 3/1994 | Shieh et al. | 372/45 |
| 5,317,170 | 5/1994 | Paoli | 257/88 |
| 5,325,386 | 6/1994 | Jewell et al. | 372/50 |
| 5,331,654 | 7/1994 | Jewell et al. | 372/45 |
| 5,337,074 | 8/1994 | Thornton | 347/237 |
| 5,349,599 | 9/1994 | Larkins | 372/50 |
| 5,351,256 | 9/1994 | Schneider et al. | 372/45 |
| 5,359,447 | 10/1994 | Hahn et al. | 359/154 |
| 5,363,397 | 11/1994 | Collins et al. | 372/92 |
| 5,373,520 | 12/1994 | Shoji et al. | 372/45 |
| 5,404,373 | 4/1995 | Cheng | 372/50 |
| 5,416,044 | 5/1995 | Chino et al. | 438/39 |
| 5,428,634 | 6/1995 | Bryan et al. | 372/45 |
| 5,446,754 | 8/1995 | Jewell et al. | 372/50 |
| 5,513,202 | 4/1996 | Kobayashi et al. | 372/96 |
| 5,530,715 | 6/1996 | Shieh et al. | 372/96 |
| 5,657,157 | 8/1997 | Lang et al. | 372/44 |
| 5,659,568 | 8/1997 | Wang et al. | 372/96 |

OTHER PUBLICATIONS

Jewell et al., "Surface–Emitting Microlasers for Photonic Switching and Interchip Connections", *Optical Engineering*, vol. 29, No. 3, Mar. 1990, pp. 210–214.

Nugent et al., "Self–Pulsations in Vertical–Cavity Surface–Emitting Lasers", *Electronic Letters*, vol. 31, No. 1, Jan. 5, 1995, pp. 43–44.

(List continued on next page.)

*Primary Examiner*—John D. Lee
*Assistant Examiner*—Quyen Phan Leung
*Attorney, Agent, or Firm*—Ian D. MacKinnon

[57] ABSTRACT

A Vertical-Cavity Surface Emitting Laser (VCSEL) for producing a filamented light output. In a preferred embodiment, this is accomplish by providing a number of discrete objects that are positioned adjacent to or within one or both of the cladding mirrors, or within the active region itself. The discrete objects may alter the reflectance, current injection and/or gain of the VCSEL at corresponding discrete locations, thereby causing the filamented light output. Besides providing a filamented output, the VCSEL of the present invention operates at a low drive current, provides high performance, and occupies less physical area than a broad-area (wide aperture) VCSEL. Thus, the VCSEL of the present invention has a number of advantages provided by a conventional laser including speed, efficiency and power, but does not suffer from many of the disadvantages of high coherence. The utilization of speckle averaging within multi-mode fiber interconnections and CD-like spatial imaging applications are contemplated.

36 Claims, 10 Drawing Sheets

OTHER PUBLICATIONS

Lee et al., "Top–Surface–Emitting GaAs Four–Quantum–Well Lasers Emitting at 0–85 μm", *Electronic Letters*, vol. 26, No. 11, May 24, 1990, pp. 710–711.

Chemla et al., "Nonlinear Optical Properties of Semiconductor Quantum Wells", *Optical Nonlinearities and Instabilities in Semiconductors*, Academic Press, Inc., Copyright 1988, pp. 83–120.

Lehman et al., "High–Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Jiang et al., "High–Frequency Polarization Self–Modulation in Vertical–Cavity Surface–Emitting Lasers", *Appl. Phys. Letters*, vol. 63, No. 26, Dec. 27, 1993, pp. 2545–2547.

Banwell et al., "VCSE Laser Transmitters for Parallel Data Links", *IEEE Jornal of Quantum Electronics*, vol. 29, No. 2, Feb. 1993, pp. 635–644.

Choa et al., "High–Speed Modulation of Vertical–Cavity Surface–Emitting Lasers", *IEEE Photonics Technology Letters*, vol. 3, No. 8, Aug. 1991, pp. 697–699.

Morgan et al., "High–Power Coherently Coupled 8×8 Vertical Cavity Surface Emitting Laser Array", *Appl. Phys. Lett.*, vol. 61, No. 10, Sep. 7, 1992, pp. 1160–1162.

Morgan et al., "Vertical–Cavity Surface–Emitting Laser Arrays", *SPIE*, vol. 2398, pp. 65–93. Feb., 1995.

Morgan et al., "Progress and Properties of High–Power Coherent Vertical Cavity Surface Emitting Laser Arrays", *SPIE*, vol. 1850, pp. 100–108. Jan., 1993.

Morgan, "Vertical Cavity Surface Emitting Lasers: The Next Generation", *SPIE*, vol. 1992, pp. 64–89. Jul. 1993.

Catchmark et al., "High Temperature CW Operation of Vertical Cavity Top Surface–Emitting Lasers", CLEO 1993. (no month available) p. 138.

Morgan et al., "Spatial–Filtered Vertical–Cavity Top Surface–Emitting Lasers", CLEO, 1993. (no month available) pp. 138–139.

Morgan et al., "Transverse Mode Control of Vertical–Cavity Top–Surface–Emitting Lasers", *IEEE Photonics Technology Letters*, vol. 4, No. 4, Apr. 1993, pp. 374–377.

Morgan et al., "Hybrid Dielectric/AlGaAs Mirror Spatially Filtered Vertical Cavity Top–Surface Emitting Laser", *Appl. Phys. Lett.*, vol. 66, No. 10, Mar. 6, 1995, pp. 1157–1159.

Morgan, "High–Performance, Producible Vertical Cavity Lasers for Optical Interconnects", *High Speed Electronics and Systems*, vol. 5, No. 4, Dec. 1994, pp. 65–95.

Miller et al., "Optical Bistability Due to Increasing Absorption", *Optics Letters*, vol. 9, No. 5, May 1984, pp. 162–164.

Morgan et al., "200° C., 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Morgan et al., "Progress in Planarized Vertical Cavity Surface Emitting Laser Devices and Arrays", *SPIE*, vol. 1562, pp. 149–159. Jul., 1991.

Morgan et al., "Novel Hybrid–DBR Single–Mode Controlled GaAs Top–Emitting VCSEL with Record Low Voltage" no date available.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

FILAMENTED MULTI-WAVELENGTH VERTICAL-CAVITY SURFACE EMITTING LASER is application claims priority under 35 U.S.C. § 119(e)(1) to co-pending U.S. Provisional Patent Application Serial No. 60/006,008, filed Oct. 25, 1995, entitled "Hybrid Dielectric/ AlGaAs Mirror, Spatially-Filtered VCSEL for Mode Control", which is assigned to the assignee of the present invention and is incorporated herein by reference.

BACKGROUND OF THE INVENTION

This invention relates to the field of semiconductor lasers, and particularly relates to vertical cavity surface emitting lasers. More particularly, this invention relates to vertical cavity surface emitting lasers that provide a filamented multi-wavelength light output.

Conventional semiconductor lasers have found widespread use in modern technology as the light source of choice for various devices, e.g., communication systems, compact disc players, and so on. The typical semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Several types of surface emitting lasers have been developed. One such laser of special promise is termed a "vertical cavity surface emitting laser" (VCSEL). (See, for example, "Surface-emitting microlasers for photonic switching and interchip connections", *Optical Engineering*, 29, pp. 210–214, March 1990, for a description of this laser. For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 $\mu$m", *Electronics Letters*, 26, pp. 710–711, May 24, 1990.) The laser described has an active region with bulk or one or more quantum well layers. On opposite sides of the active region are mirror stacks which are formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is typically turned on and off by varying the current through the active region.

For several reasons, it is desirable to use surface emitting devices. For example, surface emitting devices can be fabricated in arrays with relative ease while edge emitting devices cannot be as easily fabricated. An array of lasers can be fabricated by growing the desired layers on a substrate and then patterning the layers to form the array. Individual lasers may be separately connected with appropriate contacts. Such arrays are potentially useful in such diverse applications as, for example, image processing, inter-chip communications (i.e., optical interconnects), and so forth.

Second, typical edge-emitter lasers are turned on and off by varying the current flow through the device. This typically requires a relatively large change in the current through the device which is undesirable; the surface emitting laser, described below, requires lower drive current, and thus the change of current to switch the VCSEL need not be large.

High-yield, high performance VCSELs have been demonstrated, and exploited in commercialization. Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

VCSELs are expected to provide a performance and cost advantages in fast (e.g. Gbits/s) medium distance (e.g. up to approximately 1000 meters) single or multi-channel data link applications, and numerous optical and/or imaging applications. This results from their inherent geometry, which provides potential low-cost high performance transmitters with flexible and desirable characteristics.

In some applications, it may be desirable to use multi-mode VCSELs to overcome data communication errors associated with mode-selective losses in multi-mode optical fiber. This may arise, for example, in an optical link requiring numerous mode-selective connectors or with inadequate control in emitter or receiver coupling. In addition, in imaging or spatial applications such as CD laser applications, multi-mode VCSELs may exhibit less speckle than single mode lasers, likewise reducing the bit error rate.

One suggested approach to alleviate mode-selective losses and/or speckle penalties is to provide broad-area VCSELs. A broad-area VCSEL has a relatively large transverse dimensions relative to the light produced by the VCSEL. A limitation of broad area VCSELs is that a relatively large lateral dimension may be required to produce a multi-mode light output, particularly at a low bias current. It is known that as the size of the lasing cavity decreases, the bias current required to produce a multi-mode light output increases. Thus, to produce a multi-mode light output at a relatively low bias current, a relatively large lateral dimension (broad area) may be required. This increases the needed drive power and may limit the fabrication density of VCSEL elements and/or arrays.

Another limitation of any type of VCSEL that produce a strictly multi-mode light output (e.g. broad area VCSELs) is that some modes may be attenuated more than other modes by the optical link. Also, it may be difficult to predict which of the modes will be attenuated more than the others, particularly since each optical link application may be different. Thus, to help ensure that the projected range of optical links applications remain reliable, it may be necessary to drive relatively large bias currents through the VCSEL to help ensure that a large number of modes are produced thereby.

SUMMARY OF THE INVENTION

The present invention overcomes many of the disadvantages of the prior art by providing a VCSEL that provides a filamented light output, rather than a strictly multi-mode light output. A filamented light output differs from a multi-mode light output in that each filament operates like a separate laser, substantially independent from the other filaments. Each filament is typically coherent and may operate in a single mode, and is substantially incoherent with the other filaments. Like a multi-mode light output, a filamented light output may not be as susceptible to bit error rates resulting from mode selective losses as a single-mode emission might be when coupled into a multi-mode fiber. However, unlike a broad-area VCSEL, the VCSEL of the present invention may have a low drive current, exhibit high performance, and occupy less physical area than a broad-area (wide aperture) VCSEL.

In a preferred embodiment, the present invention contemplates laterally altering the injection current and/or reflectance of the VCSEL at a number of discrete locations. To accomplish this, a number of discrete objects may be positioned adjacent to or within one or both of the cladding mirrors, or within the active region itself. The discrete objects are preferably randomly spaced, and may be randomly sized. The discrete objects may alter the reflectance and/or current injection (and thus the gain) of the VCSEL at corresponding discrete locations, thereby causing the filamented light output. It is contemplated that each of the number of discrete objects may be any object, including patterned metal or dielectric objects, vias, or groups or clusters of dopant atoms or material.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
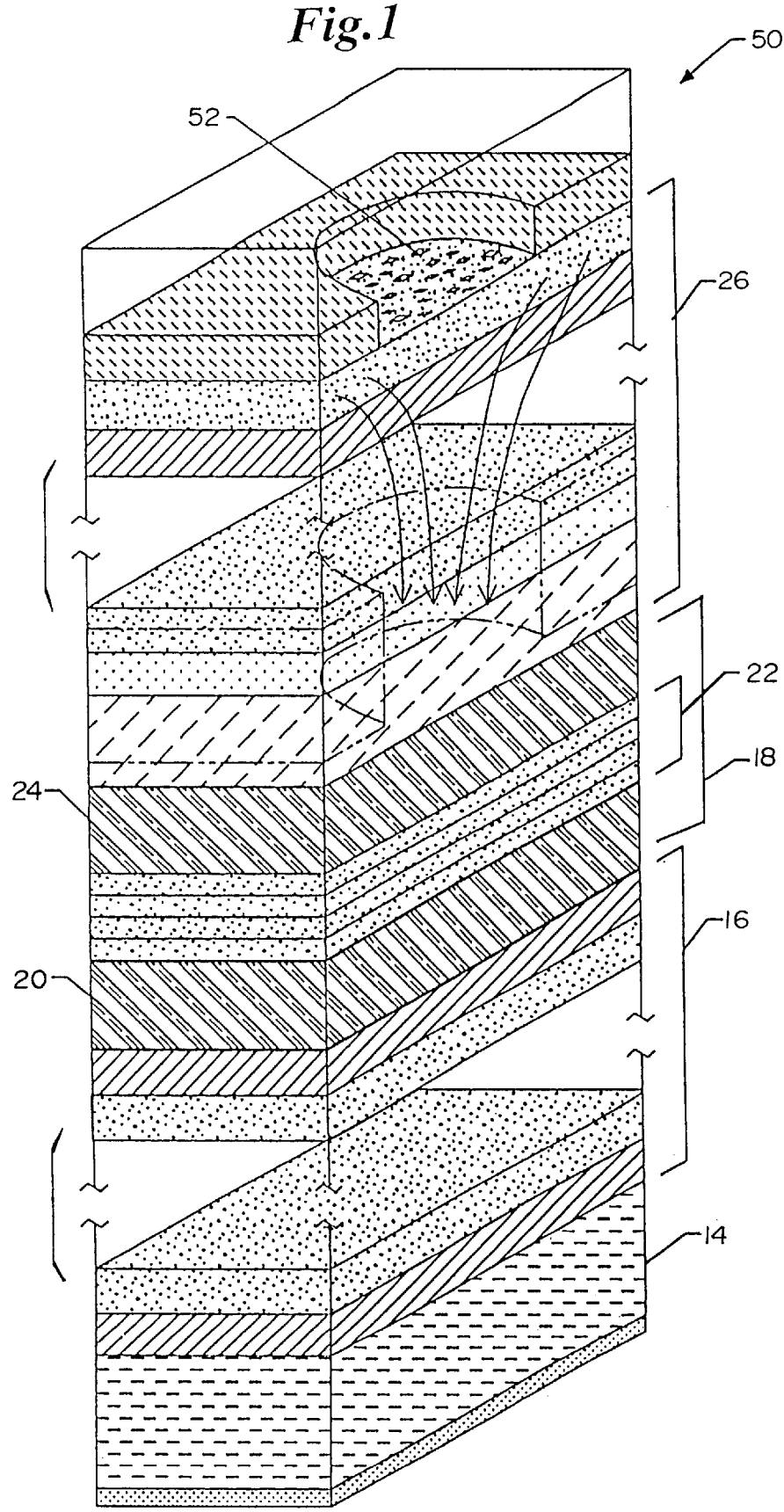
FIG. 1 is a schematic illustration of a planer, current-guided, GaAs/AlGaAs top surface emitting vertical cavity laser with a number of patterned objects on the top surface of the top mirror region in accordance with the present invention.

FIG. 1 is a schematic illustration of a planer, current-guided, GaAs/AlGaAs top surface emitting vertical cavity laser 50 with a number of patterned objects 52 disposed on the top mirror region 26. In a preferred embodiment, the n-doped substrate 14 is grown by metal organic vapor phase epitaxy (MOVPE) on a 3 inch diameter n-doped GaAs substrate. The n-type mirror stack 16 is preferably a 30.5 period n-doped (Te, $1 \times 10^{18}$ cm$^{-3}$, nominal) Al$_{0.16}$Ga$_{0.84}$As/AlAs bottom quarter wave stack, wherein each period contains a 200-Å thick graded region. Spacer 18 has a bottom confinement layer 20 and a top confinement layer 24, wherein each of the confinement layers is formed from Al$_{0.6}$Ga$_{0.4}$As. The thickness of each confinement layer 20 and 24 is chosen to make the resulting spacer 18 preferably one wavelength thick. The active region 22 is preferably a three 70-Å thick GaAs quantum-well. The p-type mirror stack 26 is preferably a 22 period p-doped (Zn, $1 \times 10^{18}$ cm$^{-3}$, nominal) Al$_{0.16}$Ga$_{0.84}$As/AlAs DBR, wherein each period contains a 200-Å thick graded region. Numerous device sizes, types and arrays may be simultaneously batch-fabricated, exploiting the flexibility of this technology platform.

To achieve filamentation, the present invention contemplates providing a number of discrete objects 52 anywhere in the lasing cavity or in the exit aperture. That is, the discrete objects 52 may be positioned anywhere within or on the p-type mirror stack 26, the spacer 18 or the n-type mirror stack 16. In the exemplary embodiment, the discrete objects 52 may be provided on top of the p-type mirror stack 26, as shown. The discrete objects 52 may be fabricated by using any number of materials, for example a patterned metal or dielectric material.

To fabricate the discrete objects 52, a layer of metal or dielectric may be deposited on the top surface of the p-type mirror stack 26. Using a mask, portions of the metal or dielectric layer may be selectively removed using a known etching technique to leave only the discrete objects 52. Preferably, the discrete objects 52 are randomly spaced, and are of different sizes. In this configuration, the discrete objects 52 may alter the reflectance and/or resistance of the p-type mirror stack 26 at discrete locations. The altered reflectance may provide diverse-Finesse lateral subcavities in the lasing aperture. The altered resistance may provide a number of discrete locations where the injection current is increased into the active region, and thus increasing the gain at those locations. In either case, a filamented light output may be provided.

Figure 2:
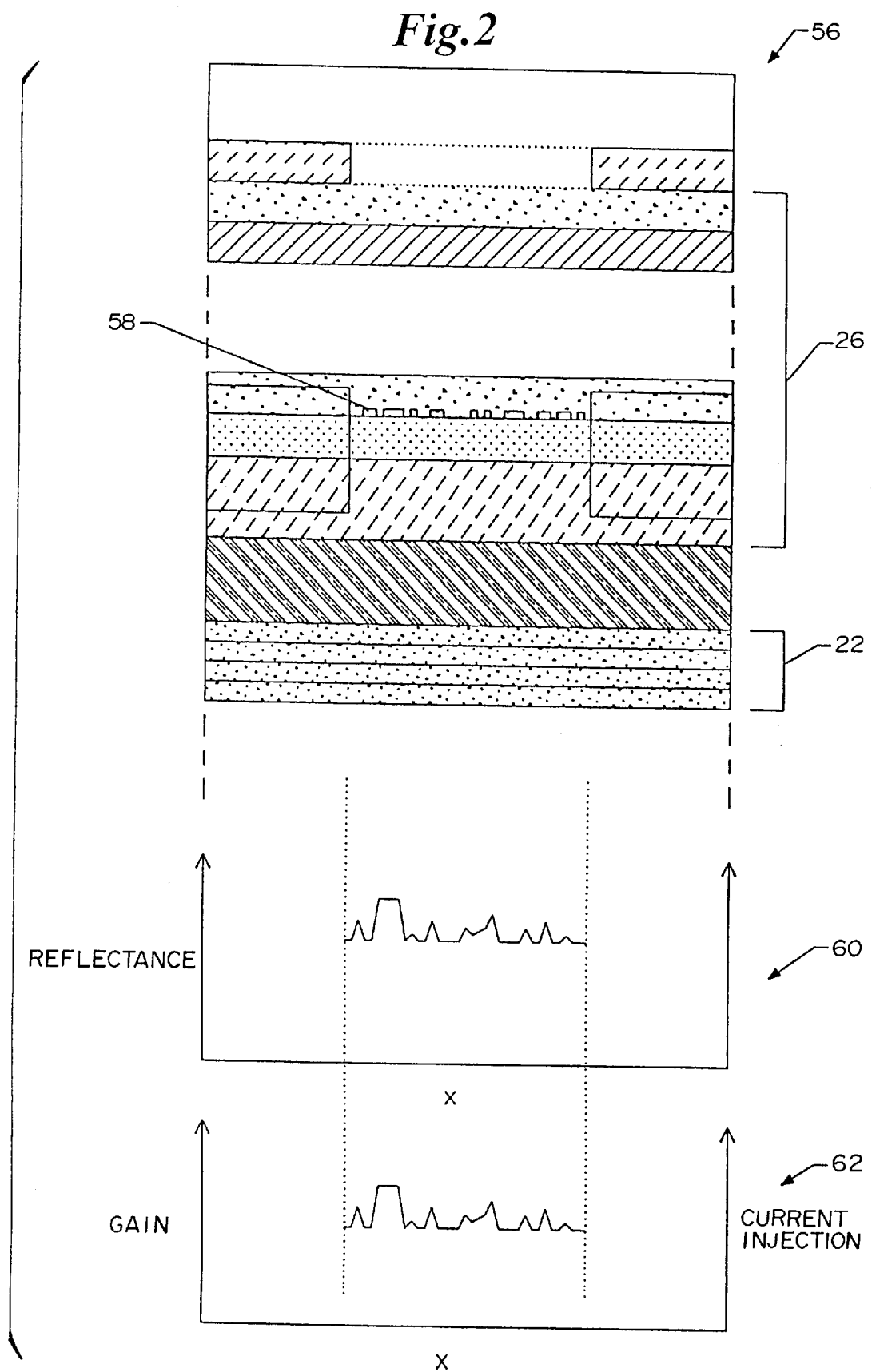
FIG. 2 is a schematic illustration of a top portion of a VCSEL in accordance with the present invention, with a number of patterned objects disposed on a selected layer of the top mirror region.

FIG. 2 is a schematic illustration of a top portion of a VCSEL 56 in accordance with the present invention. The illustrative embodiment shown in FIG. 2 is similar to the embodiment shown in FIG. 1, except that the discrete objects 58 are disposed on a selected layer within the p-type mirror stack 26, rather than on the top layer.

The graph shown at 60 illustrates one theoretical basis for why the discrete objects may cause the VCSEL 56 to produce a filamented light output. The graph 60 shows that the reflectance of the p-type mirror 26 may be altered at a number of discrete locations, which correspond to the discrete objects disposed within the p-type mirror stack 26. The discrete objects 58 may produce a number of diverse-finesse lateral sub-cavities within the lasing aperture, and thus may result in a filamented light output.

The graph shown at 62 illustrates another theoretical basis for why the discrete objects 58 may cause the VCSEL 56 to produce a filamented light output. The graph 62 shows that the injection current provided to the active region 22, by the p-type mirror 26, may be altered at a number of discrete locations. The number of discrete locations may correspond to the locations of the discrete objects 58 disposed within the p-type mirror stack 26. Because of the altered injection current, the gain of the active region 22 may also be altered at the discrete locations. These discrete gain variations are, at least in part, responsible for the filamented light output. It is recognized that the filamented output may also result from a combination of both of the above-described effects.

Figure 3:
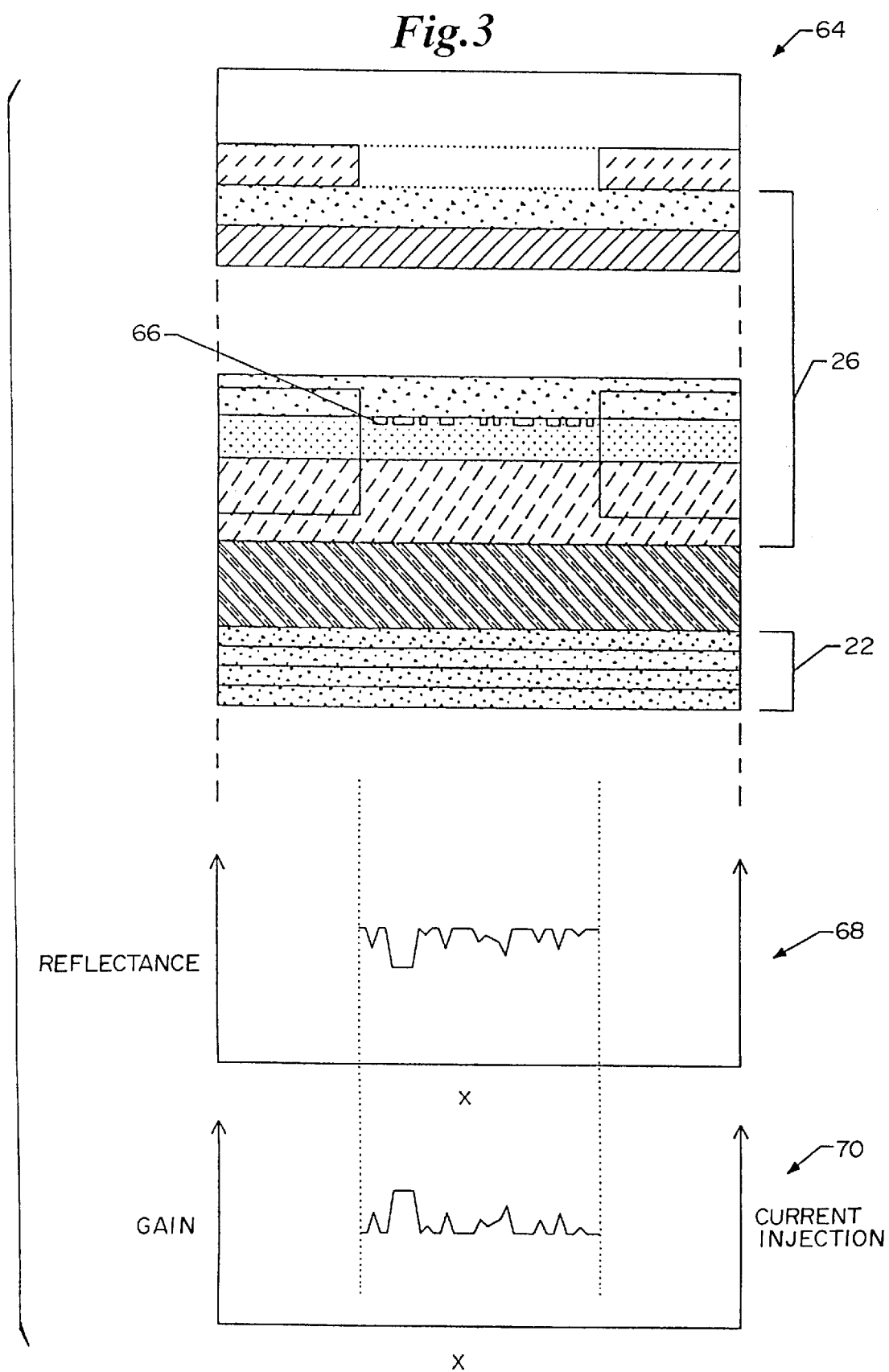
FIG. 3 is a schematic illustration of a top portion of a VCSEL in accordance with the present invention, with a number of patterned vias disposed within a selected layer of the top mirror region.

FIG. 3 is a schematic illustration of a top portion of a VCSEL 64 in accordance with the present invention with a number of patterned vias 66 disposed within a selected layer of the p-type mirror stack 26. The illustrative embodiment shown in FIG. 3 is similar to the embodiment shown in FIG. 1, except that vias 66 are disposed on a selected layer within the p-type mirror stack 26.

The graph shown at 68 illustrates one theoretical basis for why the vias 66 may cause the VCSEL 64 to produce a filamented light output. The graph 68 shows that the reflectance of the p-type mirror 26 may be altered at a number of discrete locations, which correspond to the vias 66 disposed within the p-type mirror stack 26. In this embodiment, the vias 66 may produce a number of diverse-finesse lateral sub-cavities within the lasing aperture, and thus may result in a filamented light output.

The graph shown at 70 illustrates another theoretical basis for why the vias 66 may cause the VCSEL 56 to produce a filamented light output. The graph 70 shows that the injection current provided to the active region 22, by the p-type mirror 26, may be altered at a number of discrete locations. The number of discrete locations may correspond to the locations of the vias disposed within the p-type mirror stack 26. Because of the altered injection current, the gain of the active region 22 may also be altered at the discrete locations. These discrete gain alterations are, at least in part, responsible for the filamented light output. It is recognized that the filamented output may also result from a combination of both of the above-described effects.

Figure 4:
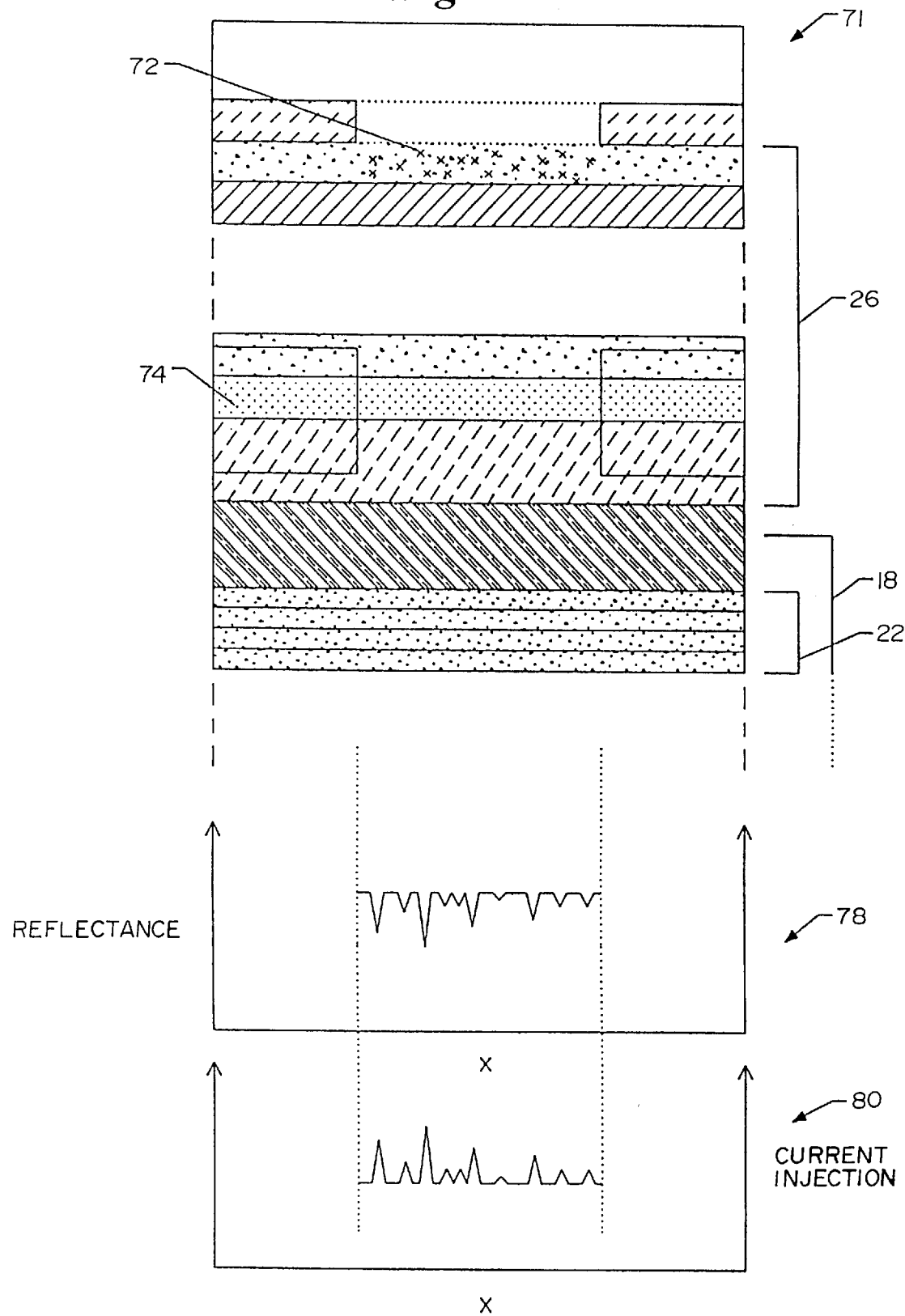
FIG. 4 is a schematic illustration of a top portion of a VCSEL in accordance with the present invention, wherein a selected layer of the top mirror region is heavily doped, beyond the saturation limit, to provide a number of randomly distributed participates therein.

FIG. 4 is a schematic illustration of a top portion of a VCSEL 70 in accordance with the present invention, wherein a selected layer of the top mirror region is heavily doped, beyond the saturation limit, to provide a number of randomly distributed clusters or participates 72 therein. In a preferred embodiment a top approximately 3000 Å of a selected layer within the p-type mirror stack 26 is doped with Zn beyond the saturation limit (between $1 \times 10^{18}$ cm$^{-3}$ and $1 \times 10^{19}$ cm$^{-3}$ of Zn in AlGaAs). Because the p-type mirror stack 26 is normally a crystalline structure, doping the p-type mirror stack 26 at a concentration above the saturation limit may cause the Zn dopant atoms to be non-uniformly distributed throughout the material. Rather, it is believed that some of the dopant atoms may be distributed in groups or clusters. It is these groups or clusters that are termed participates within the p-type mirror stack 26. It is believed that these participates alter the reflectance and/or resistance (and thus effective current injection) of the p-type mirror stack 26 at discrete locations, thus contributing to the filamented light output.

The graph shown at 78 illustrates one theoretical basis for why the dopants cause the VCSEL 71 to produce a filamented light output. The graph 78 shows that the reflectance of the p-type mirror 26 may be altered at a number of discrete locations, which correspond to the participates 72 in the p-type mirror stack 26. In this embodiment, the participates may produce a number of diverse-finesse lateral sub-cavities within the lasing aperture, and thus result in a filamented light output.

The graph shown at 80 illustrates another theoretical basis for why the dopants cause the VCSEL 71 to produce a filamented light output. The graph 80 shows that the injection current provided to the active region 22, by the p-type mirror 26, may be altered at a number of discrete locations. The number of discrete locations may correspond to the locations of the participates 72 disposed within the p-type mirror stack 26. Because of the altered injection current, the gain of the active region 22 may also be altered at the discrete locations. These discrete gain variations are, at least in part, responsible for the filamented light output. It is recognized that the filamented output may result from a combination of both of the above-described effects. In either case, a filamented output was observed for a VCSEL constructed in accordance with FIG. 4 (see FIGS. 5A, 5B and 6 below).

While FIG. 4 only shows participates in a single layer within the p-type mirror stack 26, it is contemplated that any number of layers of the p-type mirror stack 26, the n-type mirror stack 16 or the spacer 18 may be doped to provide the participates therein.

Figure 5A:
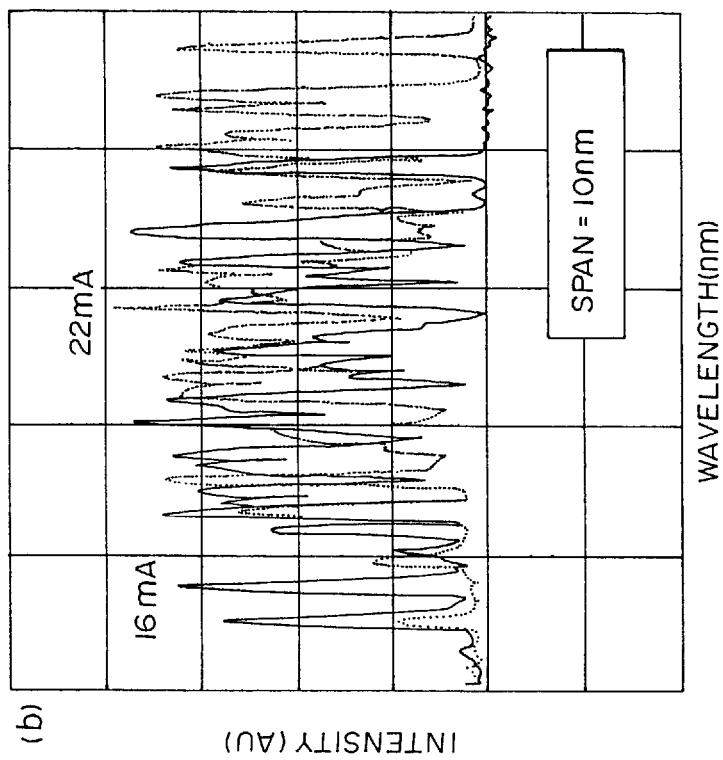
FIG. 5A and FIG. 5B are graphs of the optical spectrum for a VCSEL constructed in accordance with FIG. 4 at a variety of drive currents showing that even at low drive currents, a number of independent wavelengths are produced thereby.
Figure 5B:
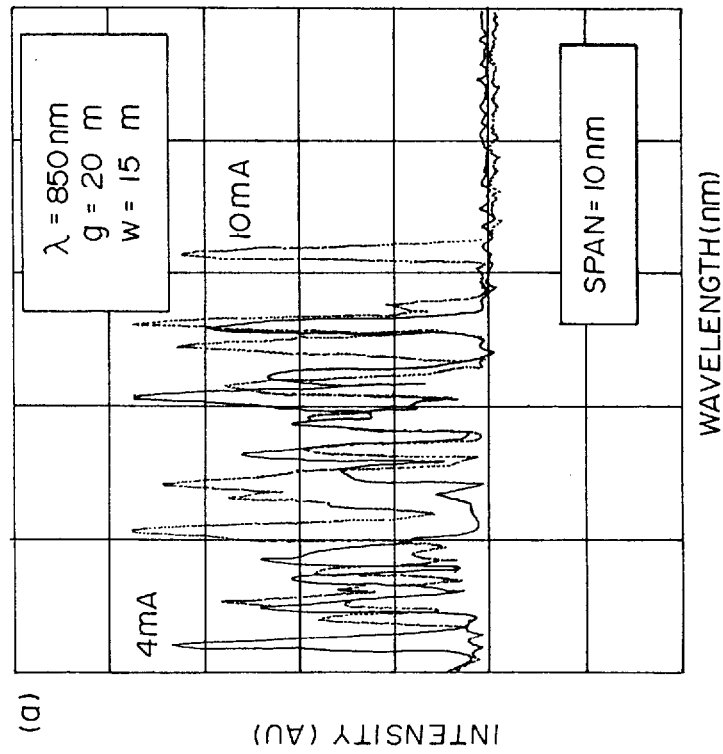

FIG. 5A and FIG. 5B are graphs of the optical spectrum for a VCSEL constructed in accordance with FIG. 4. FIG. 5A shows the optical spectrum for a VCSEL having the top about 3000 Å of the p-type mirror stack 26 heavily doped (greater than $10^{18}$ cm$^{-3}$) with Zn. The optical spectrum for a bias current of 4 mA is shown in the dark line, and the optical spectrum for a bias current of 10 mA is shown in the dashed line. FIG. 5B shows the optical spectrum for a bias current of 16 mA in the dark line, and shows the optical spectrum for a bias current of 22 mA in the dashed line.

It is noted that even with a bias current of only 4 mA, the VCSEL of the present invention produces about 15 independent wavelengths. At a 10 mA bias current, the VCSEL produces about 20 independent wavelengths. In addition, the optical spectrum is wide enough (about 5 nm) for incoherence but narrow enough not to be overly limited by fiber chromatic dispersion.

Figure 6:
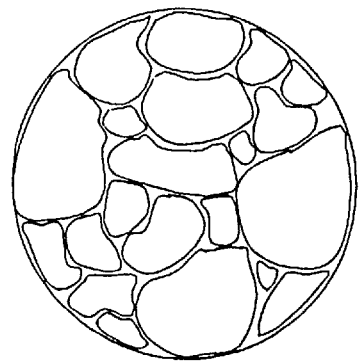
FIG. 6 is a representation of a near field observed for a VCSEL constructed in accordance with FIG. 4, showing that the near field includes randomly distributed filament modes, each incoherent with the others.

FIG. 6 is a representation of a near field observed for a VCSEL constructed in accordance with FIG. 4. The near field includes a number of randomly distributed filament modes, each mutually incoherent with one another. Further, each filament has a slightly different modal size, and experiences a different temperature, depending on the filaments location within the lasing cavity. Thus, each filament produces a slightly different wavelength.

Figure 7:
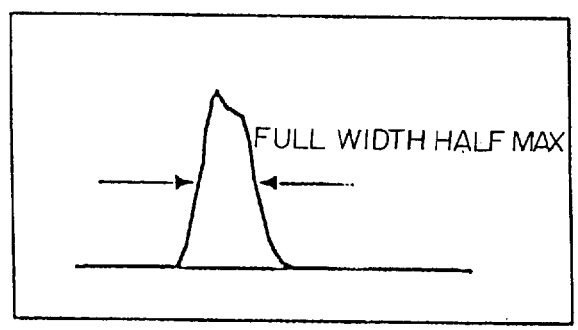
FIG. 7 is a graph of the divergence pattern for a VCSEL constructed in accordance with FIG. 4, showing that the emission pattern is nearly symmetrical and circular, and having Full Width Half Max (FWHM) of about 24 degrees.

FIG. 7 shows the resulting divergence pattern for the near field shown in FIG. 6. The divergence pattern is the incoherent superposition of the number of filaments (and some multi-modes), resulting in a nearly circularly symmetric emission pattern of about 24 degrees Full Width Half Maximum (FWHM). This corresponds to an average ($1/e^2$) filament diameter of approximately 1.8 microns. As indicated above, this wide spectrum (see FIGS. 5A and 5B) coupled with these laser-like characteristics offer the possibility of reducing bit error rates resulting from mode selective loss in multi-mode optical fiber data links. Likewise, speckle effects in imaging and other spatial applications such as CDS may be reduced because of speckle averaging. Thus, the VCSEL of the present invention has a number of advantages provided by a conventional laser including speed, efficiency and power, but does not suffer from many of the disadvantages associated with high coherence.

Figure 8:
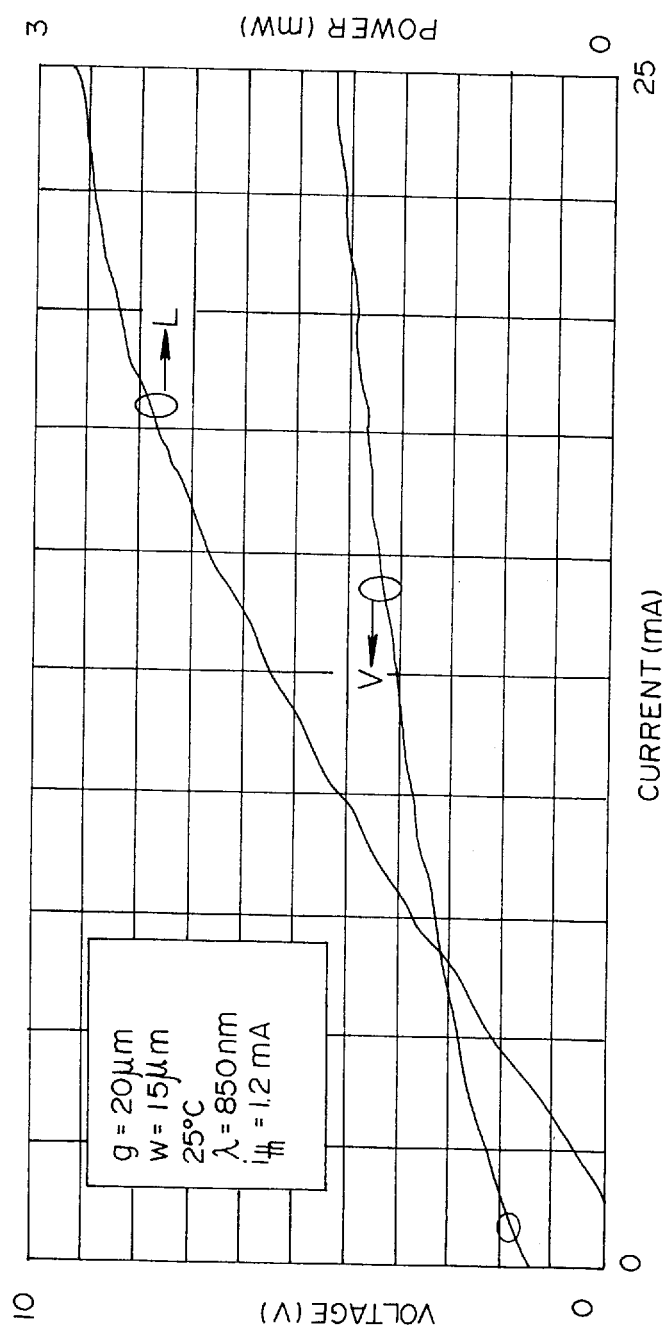
FIG. 8 is an common L-I-V graph for a VCSEL constructed in accordance with FIG. 4.

FIG. 8 is a common L-I-V graph for a VCSEL constructed in accordance with FIG. 4. It has been found that threshold currents and voltages were commonly below 2 mA and 1.8V, respectively, over an 830 to 860 nm wavelength regime. The temperature performance of these VCSELs was found to be similar to more conventional VCSELs, and the threshold current typically varied by less than ±0.5 mA, at 860 nm, over a 130° C. temperature range of −10° C. to 120° C. This illustrates the robustness and practicality of the present invention.

Figure 9:
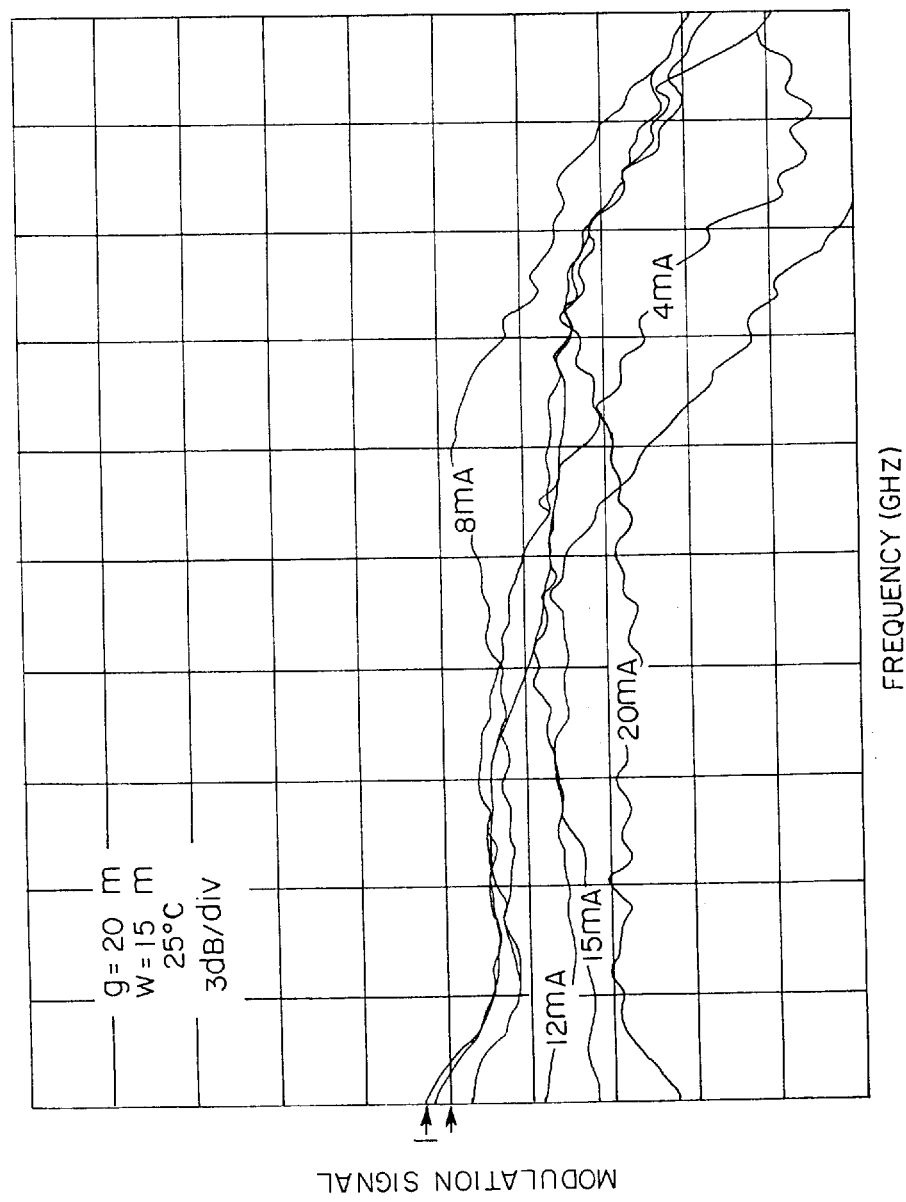
FIG. 9 is a graph of the small signal analog modulation response for a VCSEL constructed in accordance with FIG. 4, showing that even when the drive current is just above threshold, the 3 dB electrical bandwidth is greater than 3 GHz.
Figure 10B:
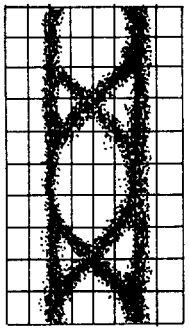
FIGS. 10A–10D show a number of eye diagrams for a VCSEL constructed in accordance with FIG. 4 taken at the fiber-channel standard bit-rate of 1.062 Gbit/s as a function of bias showing a large degree of non-uniformity in the bias current can be tolerated without serious performance consequences.
Figure 10D:
Figure 10A:
Figure 10C:
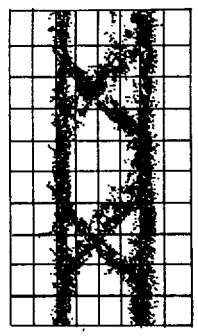

FIG. 9 is a graph of the small signal analog modulation response for a VCSEL constructed in accordance with FIG. 4. For this measurement, the VCSEL was packaged on a microwave header including a "K" connector terminated into a 50Ω Alumina line. A Hewlett Packard™ 8510 network analyzer was used to make the small signal measurements together with a New Focus™ 25 GHz photo diode detector. FIG. 9 shows that even when the drive current is just above threshold (e.g. 4 mA), the 3 dB bandwidth is greater than 3 GHz. At a typical drive current of 8 mA, the 3 dB bandwidth is about 8.3 GHz. With a 20 mA drive current, the 3 dB bandwidth is about 9.5 GHz. Importantly, for low drive currents (e.g. less than 10 mA) multi-GHz bandwidths are obtained. This is far greater than standard LED devices or even typical CD laser sources.

FIG. 10 shows a number of eye diagrams for a VCSEL constructed in accordance with FIG. 4 taken at the fiber-channel standard bit-rate of 1.062 Gbit/s as a function of bias. To obtain the eye diagrams, the VCSEL was butt-coupled through a 100 meter 62.5 µm/125 µm standard graded index multi-mode fiber. The filamented output was detected using a Hewlett Packard™ 83412B detector and displayed on a digitizing oscilloscope with a limiting bandwidth of about 1 GHz, acting as a system filter. The VCSEL used for this measurement had a threshold current of Ith= 1.75 mA, and a modulation current of Imod=6 mA. FIG. 10 shows a number of bias conditions including Ibias=Ith, Ibias=Ith−0.5 mA, Ibias=Ith−1.0 mA, and Ibias=Ith−1.5 mA. Note that for the last case, Ibias=1.75 mA−1.5 mA=0.25 mA. Thus, even for a below threshold bias current of only 0.25 mA, a wide-open eye is obtained, unlike similar broad-area multi-transverse mode VCSELs which require above threshold biasing and larger modulation currents.

The above results demonstrate that a large degree of non-uniformity in the threshold current can be tolerated at high speed without serious consequences. This intrinsic robust performance indicates that the VCSEL of the present invention can withstand manufacturing tolerances across a wafer and can be utilized in a VCSEL array (wherein the threshold current may vary) to further reduce the cost and increase the performance of a system.

Figure 11:
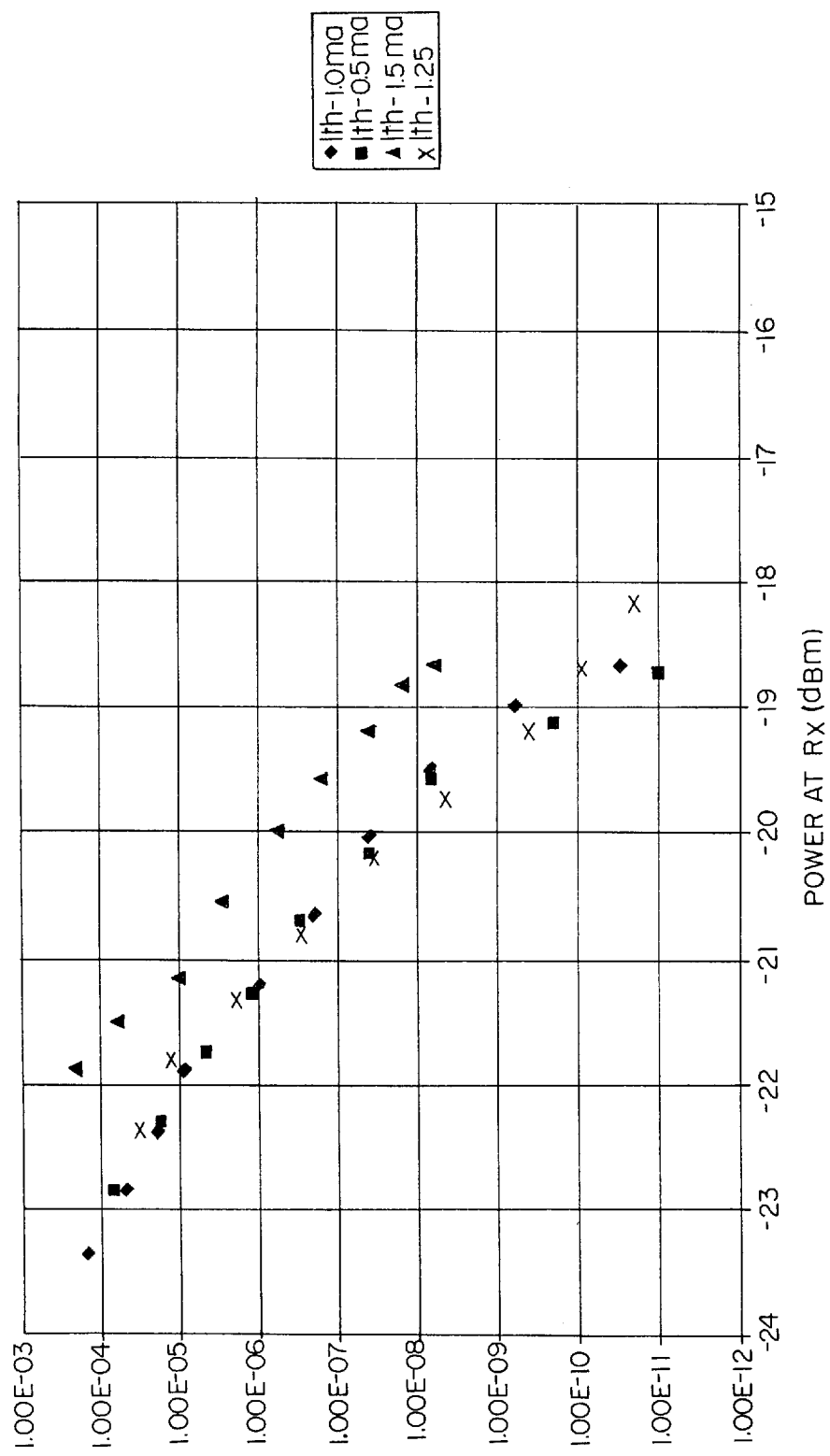
FIG. 11 is a graph of the measured Bit Error Ratio (BER) vs power for a VCSEL constructed in accordance with FIG. 4, showing that even when biased up to only 1 mA below the threshold, no penalty is observed.

FIG. 11 is a graph of the measured Bit Error Ratio (BER) vs power for a VCSEL constructed in accordance with FIG. 4. The graph shows the BER for four bias conditions including Ibias=Ith−0.5 mA, Ibias=Ith−1.0 mA, and Ibias= Ith−1.25 mA, and Ibias=Ith−1.5 mA. Note that for the last case, the Ibias=1.75 mA−1.5 mA=0.25 mA. No errors were detected in all four bias conditions over a 30 minute test, at a received power of −18 dBm. Even when biased up to 1 mA below threshold, no penalty is observed. Moreover, less than a 1 dB penalty is incurred for the low (0.25 mA) bias condition, where the power was limited to about −18 dBm due to losses in the system for this low (6 mA) modulation current.

Having thus described the preferred embodiments of the present invention, those of skill in the art will readily appreciate that the teachings found herein may be applied to yet other embodiments within the scope of the claims hereto attached.

What is claimed is:

1. A VCSEL for providing a filamented light output, comprising:
    a first mirror region electrically coupled to a first terminal, the first mirror region generally having a first reflectance value;
    a second mirror region situated substantially parallel to the first mirror region and electrically coupled to a second terminal, the second mirror region generally having a second reflectance value;
    at least one of the first and second mirror regions having a number of discrete locations, wherein each of the number of discrete locations has a different reflectance value than the corresponding first and second reflectance value; and
    an active region situated between the first and second mirror regions.

2. A VCSEL according to claim 1 wherein the first and second mirror regions each comprise a number of layers, and wherein said each of the number of discrete locations corresponds to an object positioned within one or more of the number of layers.

3. A VCSEL according to claim 2 wherein the first and second mirror regions are formed from one or more materials, and the objects are formed from a material that is different from the one or more materials.

4. A VCSEL according to claim 3 wherein the first and second mirror regions each comprise a number of layers, wherein selected ones of the number of layers are saturated with a predetermined dopant, thereby forming the number of discrete locations.

5. A VCSEL according to claim 2 wherein the objects comprise one or more dopant atoms.

6. A VCSEL according to claim 1 wherein the first and second mirror regions each comprise a number of layers, wherein at least one of the number of layers includes a patterned layer wherein the pattern corresponds to the number of discrete locations.

7. A VCSEL according to claim 6 wherein the patterned layer comprises a patterned metal layer.

8. A VCSEL according to claim 6 wherein the patterned layer comprises a patterned dielectric layer.

9. A VCSEL according to claim 1 wherein the first and second mirror regions each comprise a number of layers, wherein each of the number of discrete locations corresponds to a via positioned within one or more of the number of layers.

10. A VCSEL according to claim 1 wherein a first portion of the number of discrete locations are of a first size and a second portion of the number of discrete locations are of a second size.

11. A VCSEL according to claim 1 wherein the number of discrete locations are non-uniformly spaced.

12. A VCSEL for providing a filamented light output, comprising:
a first mirror region electrically coupled to a first terminal, the first mirror region generally having a first resistance value;
a second mirror region situated substantially parallel to the first mirror and electrically coupled to a second terminal, the second mirror region generally having a second resistance value;
at least one of the first and second mirror regions having a number of discrete locations, wherein each of the number of discrete locations has a different resistance value than the corresponding first and second resistance value; and
an active region situated between the first and second mirror regions.

13. A VCSEL according to claim 12 wherein the first and second mirror regions each comprise a number of layers, and wherein each of the number of discrete locations corresponds to an object positioned within one or more of the number of layers.

14. A VCSEL according to claim 13 wherein the first and second mirror regions are formed from one or more materials, and the object is formed from a material that is different from the one or more materials.

15. A VCSEL according to claim 13 wherein the object comprises one or more dopant atoms.

16. A VCSEL according to claim 13 wherein the first and second mirror regions each comprise a number of layers, and wherein selected ones of the number of layers are saturated with a predetermined dopant, thereby forming the number of discrete locations.

17. A VCSEL according to claim 12 wherein the first and second mirror regions each comprise a number of layers, and wherein at least one of the number of layers includes a patterned layer wherein the pattern corresponds to the number of discrete locations.

18. A VCSEL according to claim 17 wherein the patterned layer comprises a patterned metal layer.

19. A VCSEL according to claim 17 wherein the patterned layer comprises a patterned dielectric layer.

20. A VCSEL according to claim 12 wherein the first and second mirror regions each comprise a number of layers, and wherein each of the number of discrete locations corresponds to a via positioned within one or more of the number of layers.

21. A VCSEL according to claim 12 wherein a first portion of the number of discrete locations are of a first size and a second portion of the number of discrete locations are of a second size.

22. A VCSEL according to claim 12 wherein the number of discrete locations are non-uniformly spaced from one another.

23. A VCSEL for providing a filamented light output, comprising:
a first mirror region electrically coupled to a first terminal;
an active region situated below the first mirror region;
a second mirror region situated below the active region and electrically coupled to a second terminal;
an exit window positioned above the first mirror region; and
a patterned layer situated above the first mirror region and substantially aligned with the exit window, wherein the patterned layer provides filamentation to the filamented light output.

24. A VCSEL according to claim 23 wherein the patterned layer comprises a number of discrete locations of a predetermined material.

25. A VCSEL according to claim 24 wherein the predetermined material is a metal.

26. A VCSEL according to claim 24 wherein the predetermined material is a dielectric.

27. A VCSEL according to claim 24 wherein a first portion of the number of discrete locations are of a first size and a second portion of the number of discrete locations are of a second size.

28. A VCSEL according to claim 24 wherein the number of discrete locations are non-uniformly spaced from one another.

29. A VCSEL according to claim 23 wherein the patterned layer comprises a number of vias.

30. A VCSEL for providing a filamented light output, comprising:
a first mirror region electrically coupled to a first terminal;
a second mirror region situated substantially parallel to the first mirror and electrically coupled to a second terminal; and
an active region situated between the first and second mirror regions, the active region generally having a first gain, but further having a number of discrete locations wherein the gain at each of the number of discrete locations is different from the first gain value, thereby providing the filamented light output.

31. A VCSEL according to claim 30 wherein a first portion of the number of discrete locations are of a first size and a second portion of the number of discrete locations are of a second size.

32. A VCSEL according to claim 30 wherein the number of discrete locations are non-uniformly spaced from one another.

33. A VCSEL for providing a filamented light output, comprising:
a first mirror region electrically coupled to a first terminal;
a second mirror region situated substantially parallel to the first mirror and electrically coupled to a second terminal;
an active region situated between the first and second mirror regions, the active region having a gain; and
means for altering the gain at a number of discrete locations.

34. A VCSEL for providing a filamented light output, comprising:
a first mirror region electrically coupled to a first terminal, wherein the first mirror region has a reflectance;
a second mirror region situated substantially parallel to the first mirror and electrically coupled to a second terminal;
an active region situated between the first and second mirror regions, the active region having a gain; and
means provided in the first mirror region for altering the reflectance of the first mirror region at a number of discrete locations.

35. A VCSEL for providing a filamented light output, comprising:
a first mirror region electrically coupled to a first terminal, wherein the first mirror region has a resistance;
a second mirror region situated substantially parallel to the first mirror and electrically coupled to a second terminal;

an active region situated between the first and second mirror regions, the active region having a gain; and means provided in the first mirror region for altering the resistance of the first mirror region at a number of discrete locations.

36. A VCSEL for providing a filamented light output, comprising:

a first mirror region electrically coupled to a first terminal;

a second mirror region situated substantially parallel to the first mirror and electrically coupled to a second terminal;

an active region situated between the first and second mirror regions, the active region generally having a gain; and means provided in the active region for altering the gain of the active region at a number of discrete locations.

* * * * *